United States Patent [19]
Ueno et al.

[11] Patent Number: 5,459,402
[45] Date of Patent: Oct. 17, 1995

[54] DELAY TIME MEASURING CIRCUIT

[75] Inventors: Kiyoji Ueno, Kawasaki, Japan; Yuichi Miyazawa, Sunnyvale, Calif.

[73] Assignee: Kabushiki Kaisha Toshiba, Kawasaki, Japan

[21] Appl. No.: 128,881

[22] Filed: Sep. 30, 1993

[30] Foreign Application Priority Data

Oct. 2, 1992 [JP] Japan .................................. 4-264727

[51] Int. Cl.⁶ .................................................. H01L 21/66
[52] U.S. Cl. .......................... 324/617; 327/250; 327/252; 368/120
[58] Field of Search .......................... 324/617; 307/594; 365/194; 368/120; 327/250, 252

[56] References Cited

U.S. PATENT DOCUMENTS

| | | | |
|---|---|---|---|
| 2,925,960 | 2/1960 | Clauss | 324/617 |
| 3,334,303 | 8/1967 | Shepherd | 324/617 |
| 4,118,665 | 10/1978 | Reinhardt | 324/617 |
| 5,012,141 | 4/1991 | Tomisawa | 307/594 |
| 5,291,141 | 3/1994 | Farwell | 324/617 |

OTHER PUBLICATIONS

Scray: "Automatic Rise Time Measurement"—IBM Tech. Disc. Bulletin—Apr. 1960—p. 47.

*Primary Examiner*—Kenneth A. Wieder
*Assistant Examiner*—Jose M. Solis
*Attorney, Agent, or Firm*—Spensley Horn Jubas & Lubitz

[57] ABSTRACT

A delay time measuring circuit includes a delay circuit for changing the delay times of first and second clock signals output to measure the delay time of an evaluated circuit according to an externally supplied control voltage, and a voltage controlled oscillator whose oscillation frequency is controlled by the same control voltage as that used for the delay circuit, and is constructed to measure the delay time of the evaluated circuit based on an output of the voltage controlled oscillator. Therefore, it is possible to precisely evaluate the operation speed of a circuit operating at high speed.

11 Claims, 6 Drawing Sheets

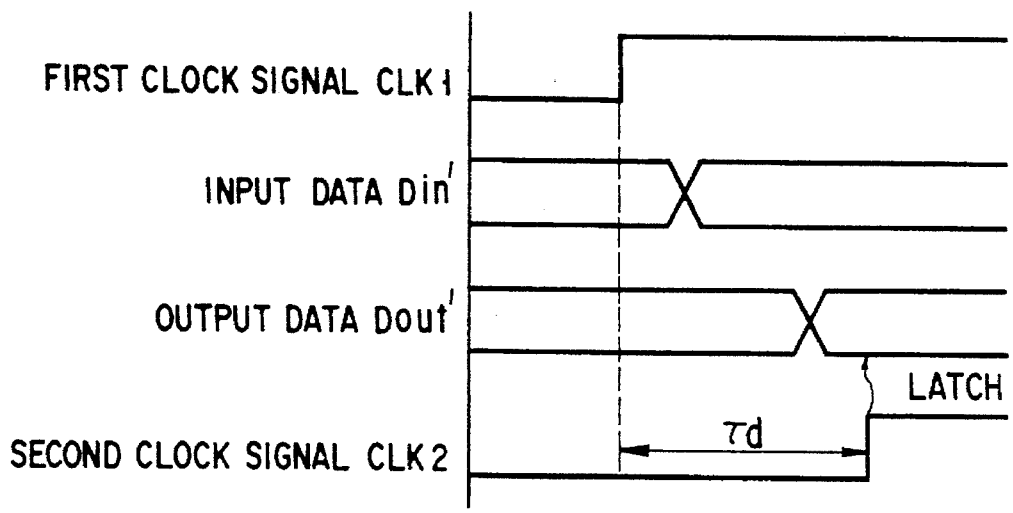
F I G. 4

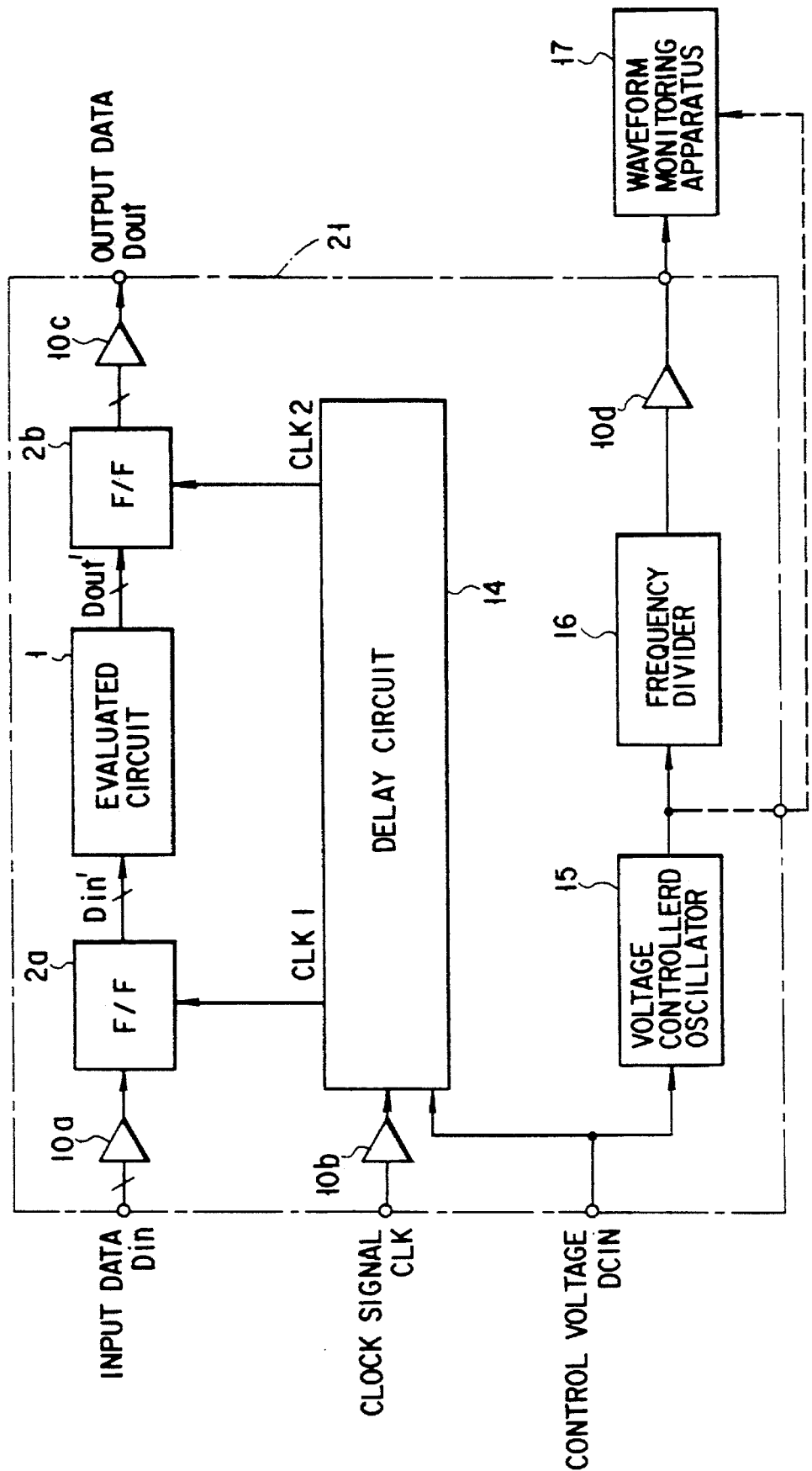
F I G. 3

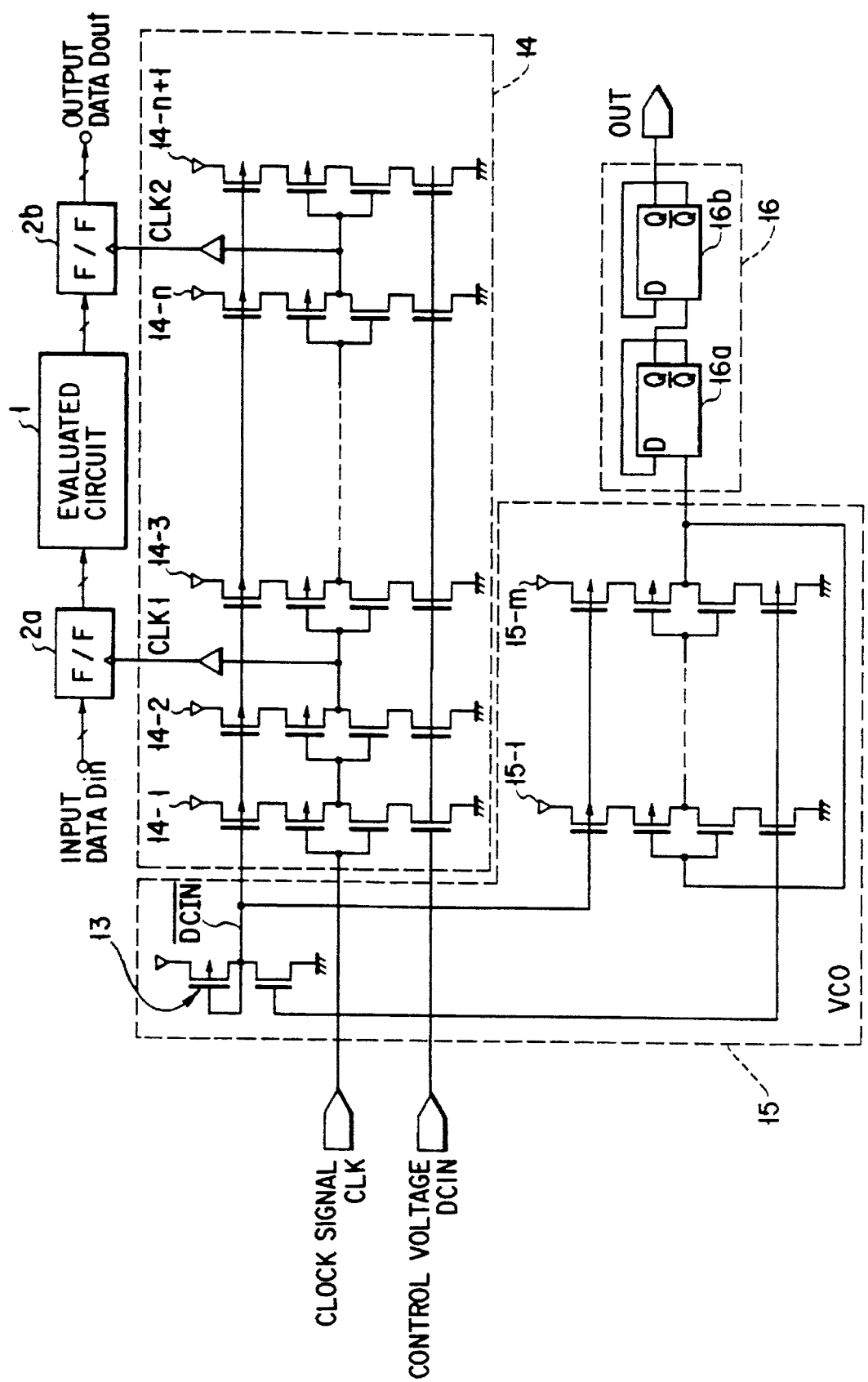
F I G. 5

DELAY TIME MEASURING CIRCUIT

BACKGROUND OF THE INVENTION

1. Field of the Invention

The present invention relates to an evaluation circuit for semiconductor integrated circuits (IC) and, more particularly, to a delay time measuring circuit used for evaluating the operation speed of a high-speed digital circuit operating at extremely high speed.

2. Description of the Related Art

FIG. 1 is a block diagram showing the construction of a conventional evaluation circuit. Conventionally, evaluation for the operation speed of semiconductor integrated circuits is effected by use of an evaluation circuit shown in FIG. 1. That is, a method by using the evaluation circuit is a method for evaluating the delay time, that is, operation speed of an evaluated circuit 1 by supplying first and second clock signals CLK1 and CLK2 from first and second external clock generators 3 and 4. The external clock generators 3 and 4 are independently provided to a flip-flop 2a for latching input data supplied to the evaluated circuit 1 and a flip-flop 2b for latching output data from the evaluated circuit 1 and detecting a phase difference between the two clock signals CLK1 and CLK2 by use of a phase difference detector 5. In this case, reference numerals 7a, 7b and 7d denote input buffers, and 7c denotes an output buffer.

FIG. 2 is a timing chart for illustrating the operation of the evaluation circuit of FIG. 1. As shown in FIG. 2, delay time $\tau_d$ between the clock signals CLK1 and CLK2 is reduced by adjusting the first and second clock generators 3 and 4 so as to change the latch timings of the flip-flops 2a and 2b until output data Dout cannot be detected as a waveform, that is, it fails to be detected. The data latching operation is effected at critical timings. Thus, the minimum permissible phase difference θ which can permit the evaluated circuit 1 to output correct data can be set. As the phase difference θ is set smaller, the operation speed of the evaluated circuit 1 becomes higher. Therefore, the operation speed of the evaluated circuit 1 can be evaluated by detecting the phase difference θ by use of the phase difference detector 5.

However, in recent, since the operation speed of ICs is extremely enhanced year by year, errors due to input buffers and input pins of the IC may occur when the conventional method in which two clock signals are independently supplied from the external device as described before. More specifically, since the clock generators 3 and 4 are independently provided, errors due to the individual clock generators 3 and 4 are introduced into the clock signals CLK1 and CLK2. Further, as shown in FIG. 2, an internal clock signal CLK1' input to the flip-flop 2a is delayed by delay time $d_1$ with respect to the clock signal CLK1 by the presence of the input pin, input buffer 7b and the like. Likewise, an internal clock signal CLK2' input to the flip-flop 2b is delayed by delay time $d_2$ with respect to the clock signal CLK2. Since the delay times $d_1$ and $d_2$ are unstable and $d_1$ is not equal to $d_2$, errors occur. Further, the error due to the phase difference detector is added to the above errors. Therefore, with the conventional evaluation method using two types of clock signals which are input from the external device to the chip, the above errors cannot be neglected, particularly, in the case of evaluation of the operation speed of a circuit which operates at extremely high speed, and a problem that desired precision cannot be attained occurs. That is, even if true delay time $\tau_d'$ can be measured, the true delay time $\tau_d'$ and apparent delay time $\tau_d$ (phase difference θ) of the evaluated circuit 1 do not coincide with each other because of the delay times $d_1 \neq d_2$, etc. and therefore the measurement precision required for evaluation cannot be attained.

SUMMARY OF THE INVENTION

An object of the present invention is to provide a delay time measuring circuit capable of correctly evaluating the operation speed of a circuit which operates at extremely high speed by internally generating two clock signals from a single clock signal source.

According to an aspect of the present invention, there is provided a delay time measuring circuit for evaluating an operation speed of an evaluated circuit comprising a single clock signal source for supplying a clock signal; first and second clock signal generating means for generating first and second clock signals used for respectively latching input and output signals of the evaluated circuit from the clock signal; delay time control means for variably controlling the delay time of the second clock signal with respect to the first clock signal; and delay time measuring means for measuring the shortest one of the delay times to evaluate the operation speed of the evaluated circuit.

According to another aspect of the present invention, there is provided a delay time measuring circuit for evaluating an operation speed of an evaluated circuit comprising an external clock signal source for supplying a clock signal to a chip in which the evaluated circuit is formed from the exterior; a delay circuit for generating first and second clock signals having different delay times and used for respectively latching input and output signals of the evaluated circuit from the clock signal; delay control means for supplying a control signal for controlling the delay times of the first and second clock signals from the exterior to the delay circuit; and a voltage controlled oscillator whose oscillation frequency is controlled by the control signal supplied to the delay circuit, for generating an output signal for detecting the delay time between the first and second clock signals.

With the above construction, first and second necessary clock signals are generated in the interior from an input clock signal supplied from the exterior, or first and second necessary clock signals are generated from the built-in clock signal source. The delay amount of the delay circuit is adjusted according to a desired voltage from the exterior to control the phase difference between the first and second clock signals CLK1 and CLK2. Thus, the timings of the latching operations of the first and second flip-flops are changed. The operation speed of the evaluated circuit is more precisely derived by deriving delay time $\tau_d$ according to the equation of $\tau_d = \frac{1}{2}Nf$ (where N is an amplitude for each unit time, and f is a frequency) by using an output waveform of the voltage controlled oscillator based on an external voltage supplied at this time or an output waveform of a frequency divider for dividing the frequency of the output thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed descrip

FIG. 3 is a block diagram showing the construction of a first embodiment of a delay time measuring circuit according to the present invention;

FIG. 4 is a timing chart for illustrating the operation of the delay time measuring circuit of FIG. 3;

FIG. 5 is a circuit diagram showing an example of the concrete construction of the main portion of FIG. 3;

DETAILED DESCRIPTION OF THE PREFERRED EMBODIMENTS

Figure 1:
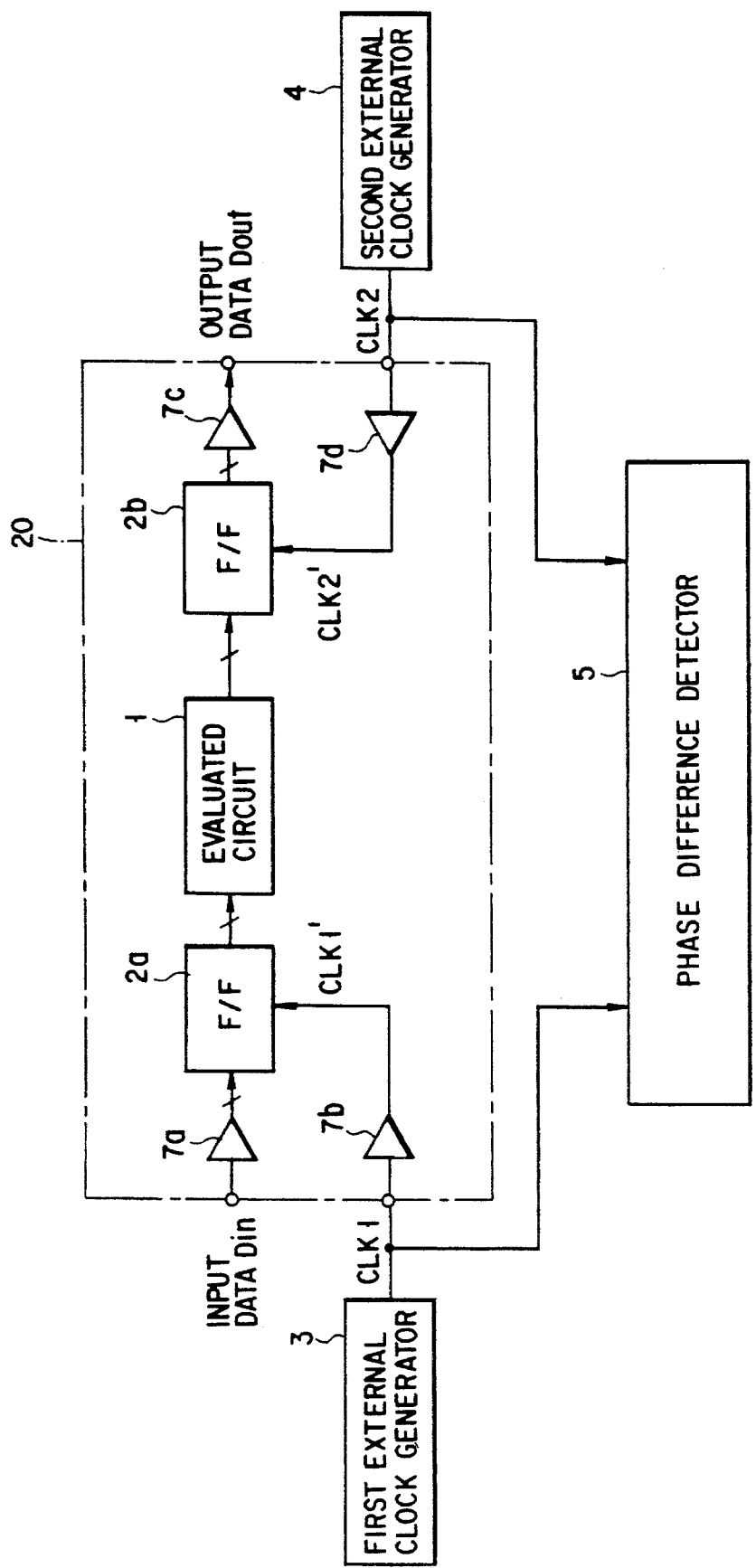
- FIG. 1 is a block diagram showing the construction of a conventional evaluation circuit.
Figure 2:
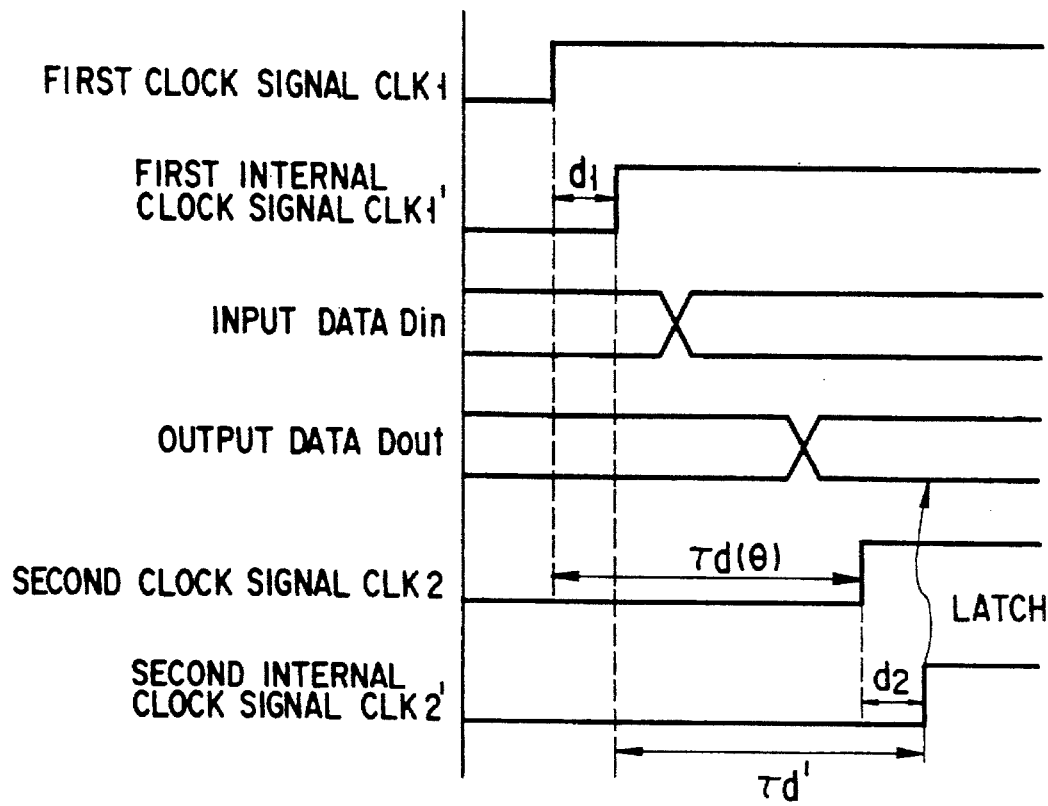
FIG. 2 is a timing chart for illustrating the operation of the evaluation circuit of FIG. 1.

There will now be described embodiments of the present invention with reference to the accompanying drawings.

FIG. 3 is a block diagram showing the construction of a first embodiment of a delay time measuring circuit according to the present invention. The delay time measuring circuit according to the first embodiment can variably control the delay amount according to a desired control voltage DCIN supplied from the external device. A delay circuit 14 to which a clock signal CLK is supplied is provided in a chip 21 in which an evaluated circuit 1 is formed. In the chip 21, a voltage controlled oscillator 15 and a frequency divider 16 are provided. The oscillator 15 is controlled by an external voltage DCIN which is the same as the voltage applied to the delay circuit 14. The frequency divider 16 divides the frequency of an output of the voltage controlled oscillator 15. Also, first and second flip-flops 2a and 2b are provided in the chip 21. The first flip-flop 2a latches input data of the evaluated circuit 1 in response to a first clock signal from the delay circuit 14 used as a clock signal. The second flip-flop 2b latches output data of the evaluated circuit 1 in response to a first clock signal from the delay circuit 14 used as a clock signal. A waveform monitoring apparatus 17 such as a synchroscope for monitoring the output waveform from the voltage controlled oscillator 15 or frequency divider 16 is provided outside the chip 21. Reference numerals 10a and 10b denote input buffers and reference numerals 10c and 10d denote output buffers.

FIG. 4 is a timing chart for illustrating the operation of the delay time measuring circuit of FIG. 3. The delay amount of the delay circuit 4 is varied by controlling the magnitude of the control voltage DCIN externally supplied, as described later, so as to control the phase difference between the first and second clocks CLK1 and CLK2. As a result, the latch timings of the first and second flip-flops 2a and 2b can be changed. The operation speed of the evaluated circuit 1 can be evaluated more precisely by counting the amplitude number N for each unit time by the waveform monitoring apparatus 17 and deriving the delay time $\tau_d$ between the first and second flip-flops 2a and 2b according to the equation $\tau_d = \frac{1}{2}Nf$ (where f is a frequency) which is derived from the equation $1/f = T = 2N\tau_d$ by use of the output waveform of the voltage controlled oscillator 15 controlled by the external voltage DCIN or the output waveform of the frequency divider 16 for dividing the frequency of the output thereof. In this case, the first and second clock signals supplied to the first and second flip-flops 2a and 2b for latching the input and output data of the evaluated circuit 1 are generated by the single delay circuit 14 whose delay amount can be variably controlled by the external voltage DCIN. That is, since the first and second clock signals CLK1 and CLK2 are generated inside the chip 21 using the clock signal as a clock source, an error caused when the first and second clock signals CLK1 and CLK2 are independently supplied from the first and second clock generators as in the prior art, an error $|d_1 - d_2|$ caused inside the chip and the like can be eliminated. As a result, the operation speed of a circuit operating at high speed can be precisely evaluated in this invention. Delay time due to the output buffer occurs in the delay amount measuring system, but this is simply a delay and is not an error. Further, in the present invention, an output waveform necessary for monitor is derived in practice by using the voltage controlled oscillator 15, which can be incorporated into the same integrated circuit as that of the delay circuit 14, and controlling the voltage controlled oscillator 15 by use of the external voltage DCIN which is the same as the control voltage for the delay circuit 14. Therefore, according to the present invention, from this point of view, the operation time of the evaluated circuit 1 can be precisely evaluated more effectively. In FIG. 4, Din' and Dout' denote actual input data and actual output data to and from the evaluated circuit 1 in FIG. 3, respectively.

Figure 6:
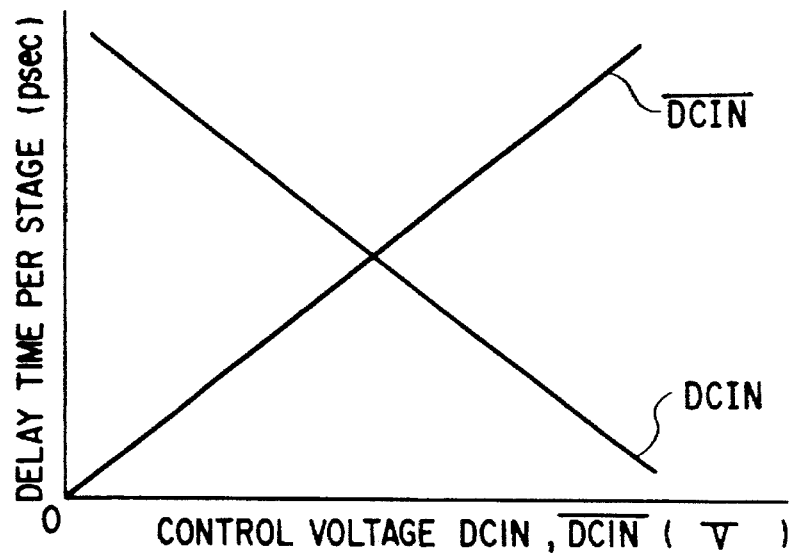
FIG. 6 is a graph showing the relation between a control voltage DCIN and a delay amount of one stage of a delay circuit.

FIG. 5 is a circuit diagram showing an example of the concrete construction of the pertinent portion of FIG. 3. In FIG. 5, a concrete example of the construction obtained by forming the delay circuit 14, voltage controlled circuit 15 and frequency divider 16 of FIG. 3 in the same integrated circuit is shown. More particularly, the delay circuit 14 is constructed by cascade-connecting clocked inverters (14-1 to 14-n+1) which are each formed of series-connected MOS transistors. The delay amount of each stage is set at the same value. As shown in FIG. 5, the delay circuit 14 is controlled by an input from the external device, that is, control voltage DCIN, and an output $\overline{DCIN}$ of an inverter circuit 13 formed of MOS transistors to change the delay amount of one stage. The resistance of a MOS transistor whose gate is applied with the control voltage DCIN becomes smaller as the voltage DCIN becomes higher. In contrast, the resistance of a MOS transistor whose gate is applied with a voltage DCIN becomes larger as the voltage $\overline{DCIN}$ becomes higher. As a result, as shown in FIG. 6, the delay amount of one stage varies directly with the control voltage $\overline{DCIN}$ and varies inversely with the control voltage DCIN. Therefore, the delay amount of the second clock signal CLK2 with respect to the first clock signal CLK1 can be controlled by adjusting the amplitude of the control voltage DCIN. The delay circuit 14 is formed such that outputs of the second stage inverter 14-2 and n-th stage inverter 14-n are respectively supplied to the first and second flip-flops 2a and 2b as the first and second clock signals CLK1 and CLK2. In this example, n=12, that is, inverters of ten stages are provided between CLK1 and CLK2. Further, the voltage controlled oscillator (VCO) 15 is constructed by the inverter circuit 13, a plurality of cascade-connected inverters 15-1 to 15-m which are each formed of series-connected MOS transistors, and a feedback loop for feeding back an output to the input terminal thereof.

The construction of each stage of the voltage controlled oscillator 15 is exactly the same as that of each stage of the delay circuit 14 and both of them are controlled by the control voltages DCIN and $\overline{\text{DCIN}}$ to set the delay amounts thereof equal to each other. The voltage controlled oscillator 15 operates as a ring oscillator which oscillates output waveforms by feeding back an output obtained by delaying an input to the input side. In this example, m=23, that is, the VCO 15 is constructed by inverters of 23 stage. Further, the frequency divider 16 is constructed by 2-stage D type flip-flops 16a and 16b. At this time, the operation speed of the evaluated circuit 1 can be precisely evaluated based on the equation $\tau_d = \frac{1}{2}Nf$ as described before by observing the amplitude number N for each unit time of an output waveform obtained by dividing the frequency of an output of the voltage controlled oscillator 15, which is controlled by the external input DCIN in the same manner by 2 by use of the frequency divider 16. That is, since the delay amount of one stage of the delay circuit 14 and the voltage controlled oscillator 15 is set to the same value and the relation between the delay amount of the voltage controlled oscillator 15 and the delay amount 10 between CLK1 and CLK2 in the delay circuit 14 is known in advance, the operation speed of the evaluated circuit 1 can be detected by monitoring an output waveform of the voltage controlled oscillator 15. In this concrete example, as shown in FIG. 6, the minimum phase difference which permits the evaluated circuit 1 to output correct data can be set by changing the delay amount of each stage of the delay circuit 14 according to the external input DCIN, to adjust the phase difference between the first and second clock signals CLK1 and CLK2 which are the outputs of the delay circuit 14 and to thus change the latching timings of the first and second flip-flops 2a and 2b.

Figure 7A:
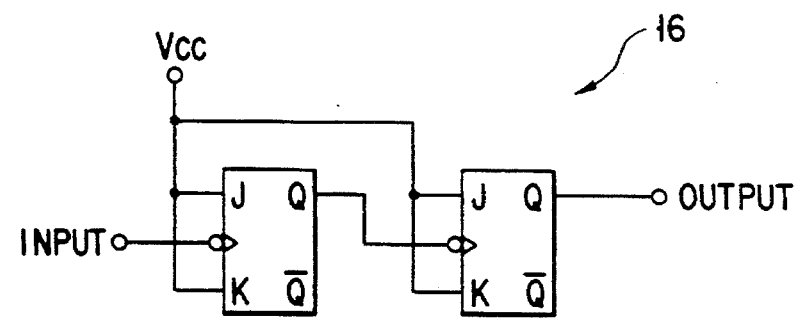
FIGS. 7A and 7B are circuit diagrams showing examples of other constructions of a frequency divider shown in FIG. 5.
Figure 7B:
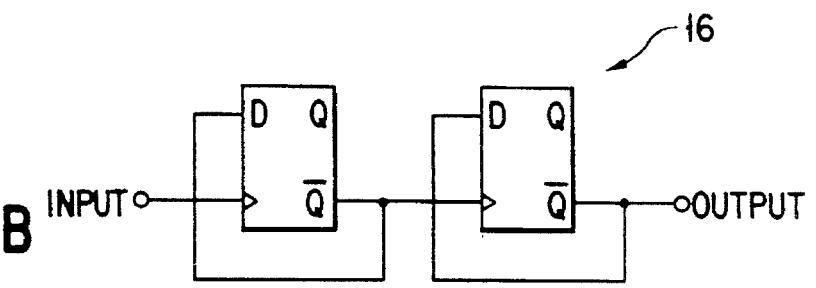

FIGS. 7A and 7B are circuit diagrams showing modifications of the frequency divider 16 of FIG. 5. FIG. 7A shows a frequency divider 16 constructed by cascade-connecting two-stage J-K type flip-flops. FIG. 7B shows a frequency divider 16 constructed by cascade-connecting two-stage D-type flip-flops. The operation of the frequency dividers is the same as that of the frequency divider 16 of FIG. 5.

Figure 8:
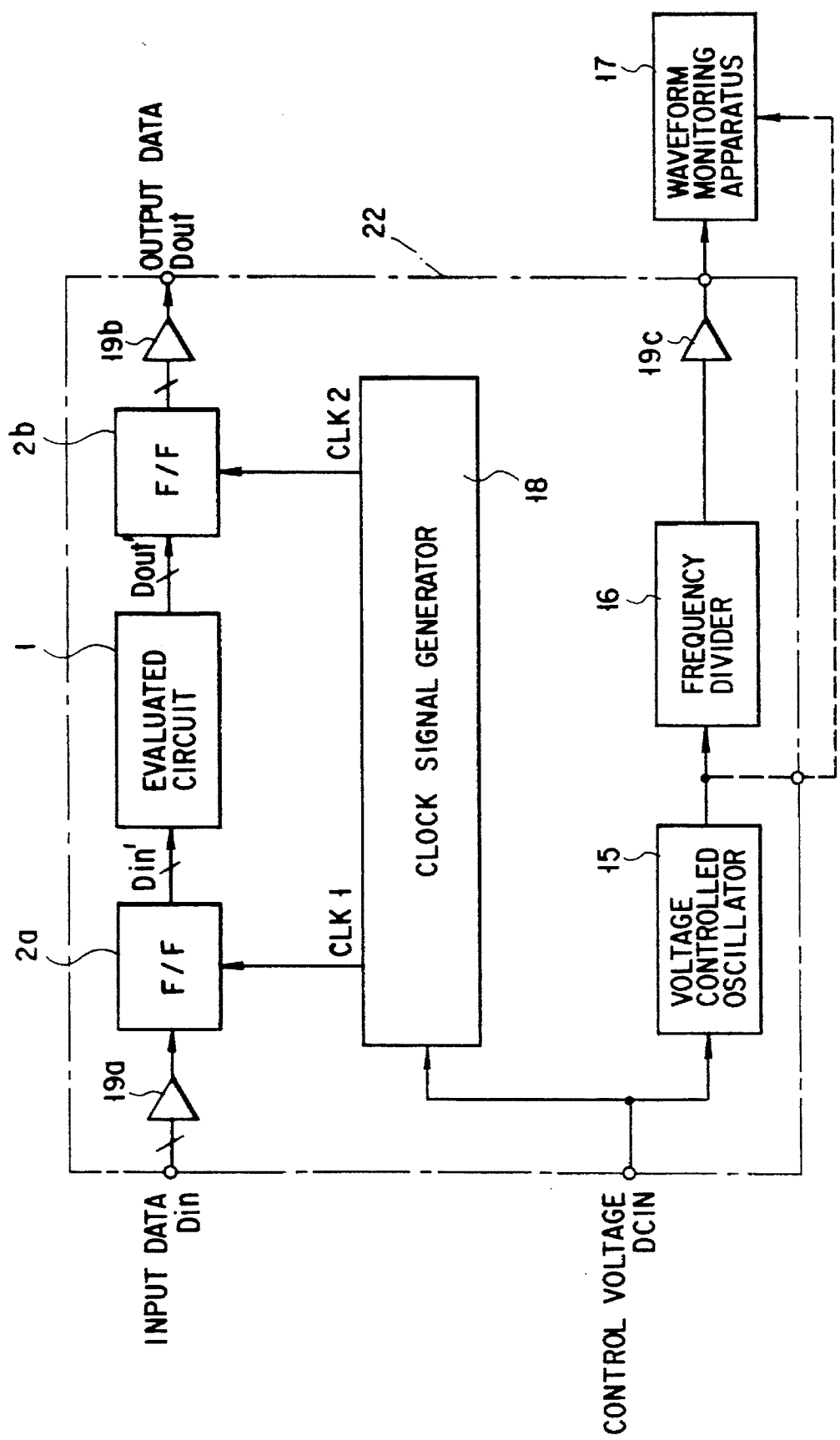
FIG. 8 is a block diagram showing the construction of a second embodiment of a delay time measuring circuit according to the present invention.

FIG. 8 is a block diagram showing the construction of a second embodiment of a delay time measuring circuit according to the present invention. In the second embodiment, a clock signal generator 18 is provided in a chip 22 without using an external clock signal source. The clock signal generator 18 has a clock signal source (not shown) and a delay circuit provided therein, and like the first embodiment, it is controlled by an external control voltage DCIN. Also, in the second embodiment, since first and second clock signals CLK1 and CLK2 are generated from a clock signal, an error caused in the prior art will not occur. The operation speed of a high-speed digital circuit can be evaluated with high precision in the second embodiment.

As described above, according to the present invention, since two clock signals can be internally generated according to an externally supplied input clock signal and the delay amount thereof can be controlled from the exterior, the operation speed of an evaluated circuit can be precisely evaluated without causing error.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A delay time measuring circuit for evaluating an operation speed of an evaluated circuit, comprising:

a single clock signal source for supplying a clock signal;

first and second clock signal generating means for generating first and second clock signals used for respectively latching input and output signals of said evaluated circuit from said clock signal;

delay time control means for variably controlling the delay time of the second clock signal with respect to the first clock signal; and delay time measuring means for measuring the shortest one of the delay times to evaluate the operation speed of said evaluated circuit.

2. A delay time measuring circuit according to claim 1, wherein said single clock signal source is constructed by one type of external clock signal source.

3. A delay time measuring circuit according to claim 1, wherein said single clock signal source is constructed by a clock signal source which is formed in the same chip as that in which said evaluated circuit is formed.

4. A delay time measuring circuit for evaluating an operation speed of an evaluated circuit, comprising:

an external clock signal source for supplying a clock signal to a chip in which said evaluated circuit is formed from the exterior;

a delay circuit for generating first and second clock signals having different delay times and used for respectively latching input and output signals of said evaluated circuit from said clock signal;

delay control means for supplying a control signal for controlling the delay times of the first and second clock signals from the exterior to the delay circuit; and a voltage controlled oscillator whose oscillation frequency is controlled by the control signal supplied to the delay circuit, for generating an output signal for detecting the delay time between the first and second clock signals.

5. A delay time measuring circuit according to claim 4, wherein said delay circuit and said voltage controlled oscillator are constructed by a plurality of cascade-connected stages of inverters with the same construction formed in the same chip, each of said inverter stages providing the same delay time.

6. A delay time measuring circuit according to claim 5, wherein said delay circuit and said voltage controlled oscillator are commonly controlled by a pair of true and complementary signals of said control signal.

7. A delay time measuring circuit according to claim 6, wherein each stage of said delay circuit and said voltage controlled oscillator is formed of series-connected MOS transistors, gates of said series-connected MOS transistors are applied with said pair of true and complementary signals and said clock signal, said delay circuit and said voltage controlled oscillator are synchronously operated and the delay times thereof are simultaneously controlled.

8. A delay time measuring circuit according to claim 7, wherein said delay control means is constructed by a variable voltage source and said control signal is formed of a DC voltage signal whose amplitude can be varied.

9. A delay time measuring circuit according to claim 4, wherein said voltage controlled oscillator is constructed by a ring oscillator having cascade-connected inverters each formed of series-connected MOS transistors and a feedback loop.

10. A delay time measuring circuit according to claim 4, wherein said delay circuit is constructed by a plurality of cascade-connected inverters each formed of series-connected MOS transistors, said first clock signal is output from a clock output terminal of a first preset one of said stages of said delay circuit and said second clock signal is output from a clock output terminal of a second preset one of said stages of said delay circuit.

11. A delay time measuring circuit according to claim 4, further comprising first and second flip-flops respectively connected to input and output terminals of said evaluated circuit, for latching input and output signals of said evaluated circuit in response to said first and second clock signals; and a frequency divider for dividing the frequency of an output of said voltage controlled oscillator to permit the minimum permissible operation time of said evaluated circuit to be measured.

\* \* \* \* \*